(12) United States Patent
Glenn et al.

(10) Patent No.: US 6,492,699 B1
(45) Date of Patent: Dec. 10, 2002

(54) IMAGE SENSOR PACKAGE HAVING SEALED CAVITY OVER ACTIVE AREA

(75) Inventors: Thomas P. Glenn, Gilbert, AZ (US); Steven Webster, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/577,692

(22) Filed: May 22, 2000

(51) Int. Cl.[7] .......................................... H01L 31/0203
(52) U.S. Cl. ...................... 257/433; 257/434; 438/116
(58) Field of Search ................. 257/433, 434; 438/116

(56) References Cited

U.S. PATENT DOCUMENTS

| | | | |
|---|---|---|---|
| 5,051,802 A | 9/1991 | Prost et al. ..................... 357/30 |
| 5,122,861 A | 6/1992 | Tamura et al. ................. 357/74 |
| 5,223,746 A * | 6/1993 | Abe et al. ..................... 257/678 |
| 5,289,002 A | 2/1994 | Tarn ............................. 250/239 |
| 5,534,725 A * | 7/1996 | Hur .............................. 257/434 |
| 5,733,382 A | 3/1998 | Hanoka ....................... 136/251 |
| 5,753,857 A | 5/1998 | Choi ........................... 174/52.4 |
| 5,773,323 A * | 6/1998 | Hur .............................. 438/123 |
| 5,798,557 A * | 8/1998 | Salatino et al. .............. 257/416 |
| 5,818,035 A | 10/1998 | Krivanek et al. ......... 250/208.1 |
| 5,821,532 A | 10/1998 | Beaman et al. ............. 250/239 |
| 5,867,368 A | 2/1999 | Glenn ......................... 361/783 |
| 5,907,178 A * | 5/1999 | Baker .......................... 257/433 |
| 5,986,317 A | 11/1999 | Wiese ......................... 257/433 |
| 6,130,448 A | 10/2000 | Bauer et al. ................. 257/222 |
| 6,172,361 B1 | 1/2001 | Holberg et al. ............. 250/239 |
| 6,184,514 B1 | 2/2001 | Rezende et al. ......... 250/208.1 |
| 6,266,197 B1 | 7/2001 | Glenn et al. ................ 359/819 |

* cited by examiner

Primary Examiner—Nathan J. Flynn
Assistant Examiner—Leonardo Anduja
(74) Attorney, Agent, or Firm—Gunnison, McKay & Hodgson, L.L.P.; Serge J. Hodgson

(57) ABSTRACT

An image sensor package includes an image sensor having an upper surface with an active area and bond pads formed thereon. A noncritical region of the upper surface is between the active area and the bond pads. A window overlies the active area and is supported on the noncritical region by a window support. The window, window support and image sensor define a sealed cavity and the active area is located within the cavity. In particular, the active area is located within the cavity, which is sealed to protect the active area against external moisture, dust and contamination.

16 Claims, 7 Drawing Sheets

IMAGE SENSOR PACKAGE HAVING SEALED CAVITY OVER ACTIVE AREA

FIELD OF THE INVENTION

The present invention relates generally to the packaging of electronic components. More particularly, the present invention relates to an image sensor package.

BACKGROUND OF THE INVENTION

Image sensors are well known to those of skill in the art. An image sensor included an active area, which was responsive to electromagnetic radiation. To avoid obstructing or distorting the electromagnetic radiation which struck the active area of the image sensor, it was important to avoid contamination, e.g., from dust, of the active area.

Image sensors were fabricated from a silicon wafer. More particularly, a plurality of image sensors were formed in a single silicon wafer. The silicon wafer was singulated, sometimes called cut-up or diced, to separate the image sensors from one another. However, during this wafer singulation, silicon shards were generated. These silicon shards had a tendency to contaminate and scratch the active areas of the image sensors. As a result, image sensors were damaged or destroying, which undesirably decreased the yield. However, to reduce cost, is important to have a high yield.

The singulated image sensor was then used to fabricate an image sensor assembly. In one conventional assembly, the image sensor was located within a housing, which supported a window. Radiation passed through the window and struck the active area of the image sensor, which responded to the radiation.

More particularly, the image sensor was mounted to a printed circuit mother board. After the image sensor was mounted, the housing was mounted around the image sensor and to the print circuit mother board. This housing provided a hermetic like seal around the image sensor, while at the same time, supported the window above the image sensor.

As the art moves to smaller and lighter weight electronic devices, it becomes increasingly important that the size of the image sensor assembly used within these electronic devices is small. Disadvantageously, the conventional image sensor assembly described above required a housing to support the window and to hermetically seal the image sensor. However, this housing was relatively bulky and extended upwards from the printed circuit mother board a significant distance, e.g., 0.100 inches (2.54 mm) to 0.120 inches (3.05 mm) or more. As a result, the image sensor assembly was relatively large.

Another important characteristic of an image sensor assembly was the temperature at which condensation formed within the housing of the image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor package includes an image sensor having an upper surface with an active area and bond pads formed thereon. A noncritical region of the upper surface is between the active area and the bond pads. A window overlies the active area and is supported on the noncritical region by a window support.

The window, window support and image sensor define a sealed cavity and the active area is located within the cavity. In particular, the active area is located within the cavity, which is sealed to protect the active area against external moisture, dust and contamination.

Recall that in the prior art, a window was supported above an image sensor with a housing. This housing was typically formed of ceramic, which was relatively expensive. Advantageously, the image sensor package in accordance with present invention eliminates the need for a housing of the prior art. Accordingly, the image sensor package is significantly less expensive to manufacture than image sensor assemblies of the prior art.

Further, since the window is attached directly to the image sensor by the window support, a distance, sometimes called the Z height, between the window and the upper surface of the image sensor can be made relatively small. As a result, the image sensor package can be made relatively thin compared to a prior art image sensor assembly.

In contrast, the housing of the prior art image sensor assembly was relatively bulky and extended upwards from the printed circuit mother board a significant distance. Since the image sensor package in accordance with the present invention can be made relatively thin, the image sensor package is well suited for use with miniature lightweight electronic devices, which require thin and lightweight image sensor assemblies.

Further, since the Z height is relatively small, the volume of the cavity is also relatively small. By minimizing the volume of the cavity, the amount of any moisture trapped within the cavity is also minimized. This, in turn, essentially eliminates the possibility of moisture condensation on the interior surface of the window or on the active area of the image sensor. As a result, the image sensor package in accordance with the present invention has a very low or nonexistent dew point.

In contrast, prior art image sensor assemblies had a significant dew point, i.e., a temperature at which condensation formed within the housing, which enclosed the image sensor and supported the window. Since the housing was relatively bulky and held a relatively large volume of air, moisture had a tendency to get trapped within the housing and to condense on the interior surface of the window or on the active area of the image sensor.

To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since the image sensor package in accordance with present invention has a very low or nonexistent dew point, the image sensor package operates satisfactorily over a broader range of temperatures and, more particularly, at lower temperatures than image sensor assemblies of the prior art.

Also in accordance with the present invention, a method of fabricating a plurality of image sensor packages in an array to reduce cost is presented. The method includes applying a bead to a noncritical region of an upper surface of an image sensor, the upper surface including an active area and bond pads, the noncritical region being between the active area and the bond pads. A window is mounted to the image sensor with the bead.

In one embodiment, the image sensor is one of a plurality of image sensors integrally connected together. In accordance with this embodiment, the method further includes singulating the plurality of image sensors.

Of importance, the active areas of the image sensors are protected by the windows (in combination with the window supports) during singulation. More particularly, the windows protect the active areas from contamination and scratching during singulation, e.g., from silicon shards. The windows also protect the active areas during subsequent processing of the image sensor package, e.g., during subsequent wire bonding and/or encapsulation and/or molding. As a result, damage or destruction of the image sensors is avoided. Accordingly, yield is increased and package cost is reduced compared to the prior art.

Further, by forming a plurality of image sensor packages simultaneously, several advantages are realized. One advantage is that it is less labor intensive to handle and process a plurality of image sensor packages simultaneously rather than to handle and process each image sensor package on an individual basis. Another advantage is that usage of materials is more efficient when an array of image sensor packages is fabricated. By reducing labor and using less material, the cost associated with each image sensor package is minimized.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
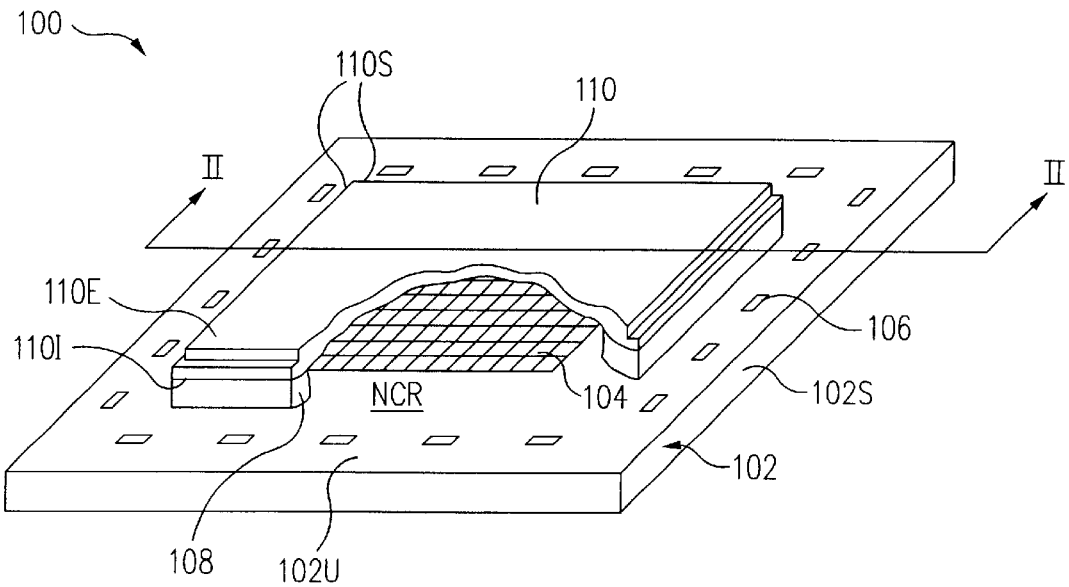
FIG. 1 is a perspective view, partially cutaway, of an image sensor package in accordance with the present invention.

In accordance with the present invention, an image sensor package 100 (FIGS. 1 and 2A), hereinafter package 100, includes an image sensor 102 having an upper surface 102U with an active area 104 and bond pads 106 formed thereon. A noncritical region NCR of upper surface 102U is between active area 104 and bond pads 106. A window 110 overlies active area and is supported on noncritical region NCR by a window support 108.

Window 110, window support 108 and image sensor 102 define a sealed cavity 118 and active area 104 is located within cavity 118. In particular, active area 104 is located within cavity 118, which is sealed to protect active area 104 against external moisture, dust and contamination.

Recall that in the prior art, a window was supported above an image sensor with a housing. This housing of a prior art image sensor assembly was typically formed of ceramic, which was relatively expensive. Advantageously, package 100 in accordance with present invention eliminates the need for a housing of the prior art. Accordingly, package 100 is significantly less expensive to manufacture than image sensor assemblies of the prior art.

Further, since window 110 is attached directly to image sensor 102 by window support 108, a distance ZH, sometimes called the Z height, between window 110 and upper surface 102U can be made relatively small. As a result, package 100 can be made relatively thin compared to a prior art image sensor assembly.

In contrast, the housing of the prior art image sensor assembly was relatively bulky and extended upwards from the printed circuit mother board a significant distance. Since package 100 can be made relatively thin, package 100 is well suited for use with miniature lightweight electronic devices, which require thin and lightweight image sensor assemblies.

Further, since distance ZH is relatively small, the volume of cavity 118 is also relatively small. By minimizing the volume of cavity 118, the amount of any moisture trapped within cavity 118 is also minimized. This, in turn, essentially eliminates the possibility of moisture condensation on interior surface 110I of window 110 or on active area 104 of image sensor 102. As a result, package 100 has a very low or nonexistent dew point.

In contrast, prior art image sensor assemblies had a significant dew point, i.e., a temperature at which condensation formed within the housing, which enclosed the image sensor and supported the window. Since the housing was relatively bulky and held a relatively large volume of air, moisture had a tendency to get trapped within the housing and to condense on the interior surface of the window or on the active area of the image sensor.

To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since package 100 has a very low or nonexistent dew point, package 100 operates satisfactorily over a broader range of temperatures and, more particularly, at lower temperatures than image sensor assemblies of the prior art.

Also in accordance with the present invention, a method of fabricating a plurality of packages 100 in an array to reduce cost is presented. The method includes applying a bead 606A (FIG. 6) to a noncritical region NCR1 of an upper surface 102U of an image sensor 102A. Upper surface 102U includes an active area 104A and a bond pad 106A, noncritical region NCR1 being between active area 104A and bond pad 106A. A window 110C (FIG. 7A) is mounted to image sensor 102A with bead 606A, bead 606A forming a window support 108C.

In one embodiment, image sensor 102A is one of a plurality of image sensors 102 integrally connected together. In accordance with this embodiment, the method further includes singulating the plurality of image sensors 102.

Of importance, active areas 104 of image sensors 102 are protected by windows 110 (in combination with window supports 108) during singulation. More particularly, windows 110 protect active areas 104 from contamination and scratching during singulation, e.g., from silicon shards. Windows 110 also protect active areas 104 during subsequent processing of packages 100, e.g., during subsequent wire bonding and/or encapsulation and/or molding. As a result, damage or destruction of image sensors 102 is avoided. Accordingly, yield is increased and package cost is reduced compared to the prior art.

Further, by forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each package 100 is minimized.

Figure 2A:
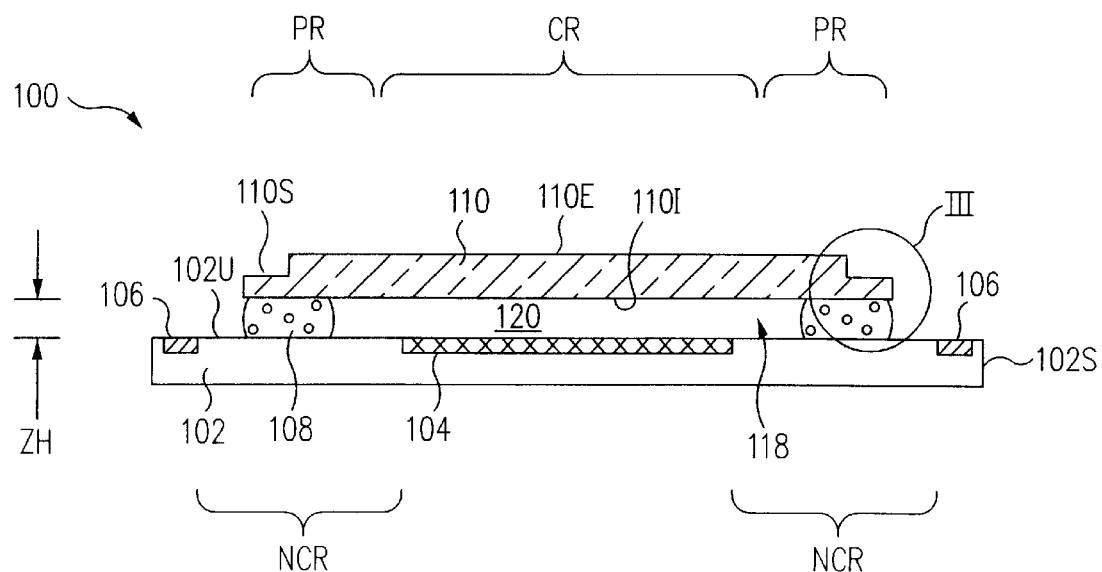
FIGS. 2A, 2B and 2C are cross-sectional views of the package along the line II—II of FIG. 1 in accordance with various embodiments of the present invention.

More particularly, FIG. 1 is a perspective view, partially cutaway, of a package 100 in accordance with the present invention. FIG. 2A is a cross-sectional view of package 100 along the line II—II of FIG. 1 in accordance with one embodiment of the present invention.

Referring to FIGS. 1 and 2A together, package 100 includes an image sensor 102, sometimes called a sensor device. Image sensor 102 includes an active area 104, sometimes called an image array. Active area 104 is on an upper, e.g., first, surface 102U of image sensor 102. Generally, active area 104 is responsive to radiation, e.g., electromagnetic radiation, as is well known to those of skill in the art. For example, active area 104 is responsive to infrared radiation, ultraviolet light, and/or visible light. Illustratively, image sensor 102 is a CMOS image sensor device, a charge coupled device (CCD), a pyroelectric ceramic on CMOS device, or an erasable programmable read-only memory device (EPROM) although other image sensors are used in other embodiments.

Image sensor 102 further includes a plurality of bond pads 106 on upper surface 102U of image sensor 102. Bond pads 106 are formed on the perimeter of upper surface 102U adjacent sides 102S of image sensor 102. Bond pads 106 are connected to the internal circuitry of image sensor 102. Active area 104 is inwards of bond pads 106.

A noncritical region NCR of upper surface 102U of image sensor 102 is between active area 104 and bond pads 106. Noncritical region NCR is shaped as a rectangular, e.g., square, annulus around the periphery of active area 104 and surrounded by bond pads 106.

Formed on noncritical region NCR is a window support 108. More particularly, window support 108 is attached to, supported by, and, in this embodiment, contacts noncritical region NCR yet does not extend over active area 104 or bond pads 106. In one embodiment, window support 108 is transparent to the radiation of interest, e.g., to the radiation to which active area 104 of image sensor 102 is responsive, as those of skill in the art will understand. However, it is not essential that window support 108 is transparent, and in another embodiment, window support 108 is opaque to the radiation of interest.

In this embodiment, window support 108 is an epoxy bead, e.g., a bead formed of B-staged epoxy, which has been setup, i.e., cured, gelled, or made tacky. In one particular embodiment, window support 108 is Masterbond 150 manufactured by Masterbond, Inc., 154 Hobart St., Hackensack, N.J., 07601 or Hysol 4451 manufactured by Dexter Corporation, 15051 East Don Julian Road, Industry, Calif., 91746.

Window support 108 is in contact with and supports a window 110 on noncritical region NCR of upper surface 102U of image sensor 102. Window 110 includes an interior, e.g., first, surface 110I and an exterior, e.g., second, surface 110E opposite interior surface 110I. Interior surface 110I is secured to window support 108 and exterior surface 110E is exposed to the ambient environment. Window 110 further includes sides 110S which extend between exterior surface 110E and interior surface 110I.

In this embodiment, window support 108 contacts a peripheral region PR of interior surface 110I but does not contact sides 110S. Peripheral region PR of interior surface 110I is directly adjacent sides 110S and surrounds a central region CR of interior surface 110I. Window 110 and, more particularly, central region CR of interior surface 110I of window 110 overlies active area 104.

Window 110 is parallel to upper surface 102U of image sensor 102. More particularly, a plane defined by interior surface 110I (or exterior surface 110E) is parallel to a plane defined by upper surface 102U of image sensor 102.

Window support 108 forms a seal between peripheral region PR of interior surface 110I of window 110 and noncritical region NCR of upper surface 102U of image sensor 102. Thus, window 110, window support 108, and image sensor 102 define a cavity 118, which is sealed. In particular, active area 104 is located within cavity 118, which is sealed to protect active area 104 against external moisture, dust and contamination.

Generally, cavity 118 contains a medium 120, which is transparent to the radiation of interest, e.g., to the radiation to which active area 104 of image sensor 102 is responsive. For example, if the radiation of interest is visible light, medium 120 should have a low refractive index so that medium 120 will not reduce the effectiveness of detector cells such as color or $\mu$-lens fitted detector cells within active area 104. Further, medium 120 should be free from physical defects, which may cause point defects in a received spatial light pattern. In one embodiment, medium 120 is air.

Window 110 is transparent to the radiation of interest, e.g., to the radiation to which active area 104 of image sensor 102 is responsive, as those of skill in the art will understand. In one particular embodiment, window 110 is optically transparent borosilicate glass.

Generally, the transmittance of window 110 and medium 120 is sufficient to allow the necessary minimum amount of radiation needed for the proper operation of image sensor 102 to pass through window 110 and medium 120.

During use, radiation is directed at package 100. This radiation passes through window 110 and medium 120 and strikes active area 104, which responds to the radiation as is well known to those of skill in the art. However, in an alternative embodiment, active area 104 of image sensor 102 transmits radiation such as electromagnetic radiation. For example, image sensor 102 is a light emitting diode (LED) micro-display. In accordance with this embodiment, radiation transmitted by active area 104 passes through medium 120 and window 110, and emanates from package 100. For simplicity, in the above and following discussions, active area 104 as a receiver of radiation is set forth. However, in light of this disclosure, those of skill in the art will recognize that generally active area 104 is a receiver of radiation, a transmitter of radiation, or a transceiver, i.e., a transmitter and a receiver, of radiation.

Since window 110 is attached directly to image sensor 102 by window support 108, a distance ZH, sometimes called the Z height, between window 110 and upper surface 102U can be made relatively small. To illustrate, distance ZH is in the range of approximately 0.003 to 0.010 inch (0.08 to 0.25 mm). As a result, package 100 can be made relatively thin compared to a prior art image sensor assembly. To illustrate, a 0.039 inch (1.0 mm) or less thickness for package 100 is easily achievable.

In contrast, the housing of the prior art image sensor assembly was relatively bulky and extended upwards from the printed circuit mother board a significant distance, e.g., 0.100 inches (2.54 mm) to 0.120 inches (3.05 mm) or more. Since package 100 can be made relatively thin, package 100 is well suited for use with miniature lightweight electronic devices, which require thin and lightweight image sensor assemblies.

Since distance ZH is relatively small, the volume of cavity 118 is also relatively small. By minimizing the volume of cavity 118, the amount of any moisture trapped within cavity 118 is also minimized. This, in turn, essentially eliminates the possibility of moisture condensation on interior surface 110I of window 110 or active area 104 of image sensor 102. As a result, package 100 has a very low or nonexistent dew point.

In contrast, prior art image sensor assemblies had a significant dew point, i.e., a temperature at which condensation formed within the housing, which enclosed the image sensor and supported the window. Since the housing was relatively bulky and held a relatively large volume of air, moisture had a tendency to get trapped within the housing and to condense on the interior surface of the window or on the active area.

To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since package 100 has a very low or nonexistent dew point, package 100 operates satisfactorily over a broader range of temperatures and, more particularly, at lower temperatures than image sensor assemblies of the prior art.

Figure 2B:
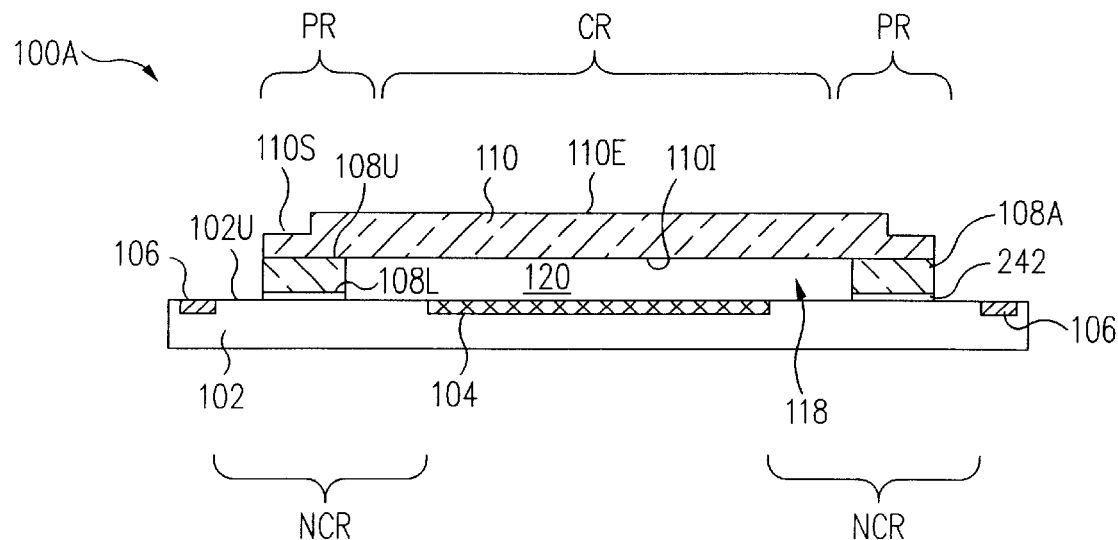

FIG. 2B is a cross-sectional view of a package 100A along the line II—II of FIG. 1 in accordance with another embodiment of the present invention. Package 100A of FIG. 2B is substantially similar to package 100 of FIG. 2A and only the significant differences are discussed below.

Referring to FIG. 2B, in this embodiment, window support 108A is a rectangular, e.g., square, ring, i.e., is a rectangular block having a rectangular hole extending through the middle.

An upper, e.g., first, surface 108U of window support 108A is attached to peripheral region PR of interior surface 110I of window 110, for example, with an epoxy adhesive or tape. Window 110 and window support 108A thus form an inverted cup shaped enclosure.

In one embodiment, window support 108A is formed of the same material as the material of window 110, e.g., borosilicate glass. By forming window support 108A and window 110 of the same material, stress generated between window 110 and window support 108A, e.g., due to differences in thermal expansion, are minimized or eliminated.

A lower, e.g., second, surface 108L of window support 108A is attached to noncritical region NCR of upper surface 102U of image sensor 102 by an adhesive layer 242. Illustratively, adhesive layer 242 is QMI 536 or QMI 550 manufactured by Quantum Materials, 9938 Via Pasar, San Diego, Calif., 92126.

Figure 2C:
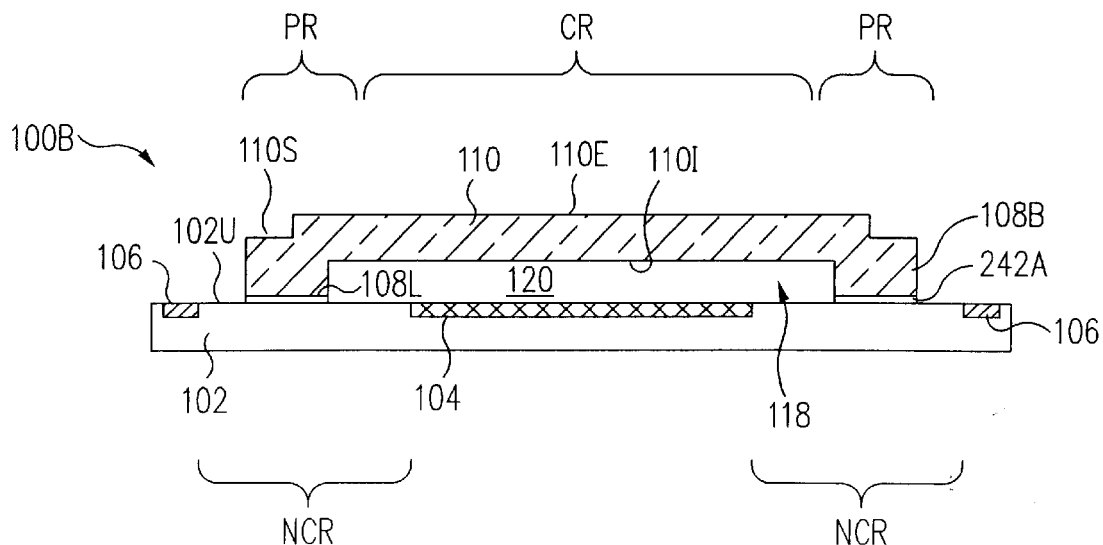

FIG. 2C is a cross-sectional view of a package 100B along the line II—II of FIG. I in accordance with yet another embodiment of the present invention. Package 100B of FIG. 2C is substantially similar to package 100 of FIG. 2A and only the significant differences are discussed below.

Referring to FIG. 2C, window support 108B is a rectangular, e.g., square, ring. However, in this embodiment, window support 108B and window 110 are integral, i.e., are formed of a single piece and not of a plurality of separate pieces connected together. For example, as described in detail below with reference to FIG. 4C, window support 108B and window 110 are formed from a single integral sheet, e.g., of borosilicate glass.

A lower, e.g., first, surface 108L of window support 108B is attached to noncritical region NCR of upper surface 102U of image sensor 102 by an adhesive layer 242A.

For simplicity, package 100 of FIG. 2A is illustrated in FIGS. 3, 8, 9 and 10 and discussed below. However, in light of this disclosure, it is understood that package 100A of FIG. 2B or package 100B of FIG. 2C could equally be used in place of package 100 of FIG. 2A.

Figure 3:
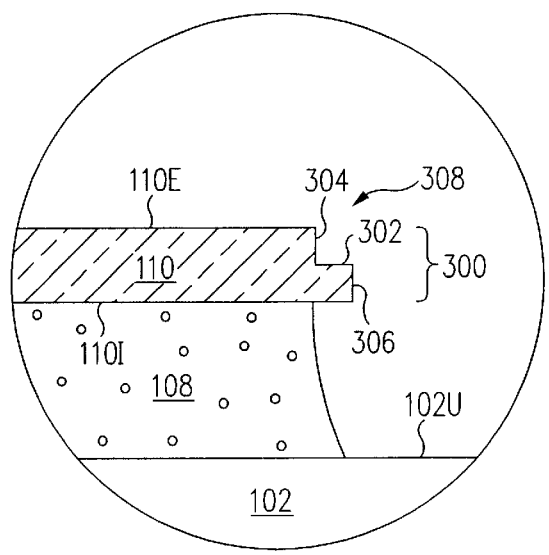
FIG. 3 is an enlarged cross-sectional view of the region III of the package of FIG. 2A.

FIG. 3 is an enlarged cross-sectional view of the region III of package 100 of FIG. 2A. Referring now to FIG. 3, window 110 includes a locking feature 300 along the periphery of window 110. Generally, locking feature 300 mechanically locks window 110 to the package body, e.g., to plastic or liquid encapsulant, as discussed in greater detail below in reference to FIGS. 8, 9 and 10.

Locking feature 300 is formed along sides 110S (FIGS. 1, 2A) of window 110. In this embodiment, locking feature 300 is shaped as a ledge, sometimes called a step, which extends around the periphery of window 110. More particularly, locking feature 300 includes a rectangular ring-like shelf 302, e.g., a third surface, which extends around exterior surface 110E. Shelf 302 is located on a plane parallel to, and located between, a plane defined by exterior surface 110E and a plane defined by interior surface 110I.

Step sides 304 extend between exterior surface 110E and shelf 302 and step sides 306 extend between shelf 302 and interior surface 110I. In this embodiment, step sides 304, 306, are perpendicular to planes defined by exterior surface 110E, interior surface 110I, and shelf 302.

Of importance, shelf 302 and step sides 304 define a pocket 308. As discussed in greater detail below with reference to FIGS. 8, 9 and 10, the package body extends into and fills pocket 308 thus mechanically locking window 110 into place. Although locking feature 300 is illustrated as a ledge in FIG. 3, in light of this disclosure, those of skill in the art will understand that other locking features can be used. Further, in one embodiment, window 110 does not include a locking feature.

Figure 4A:
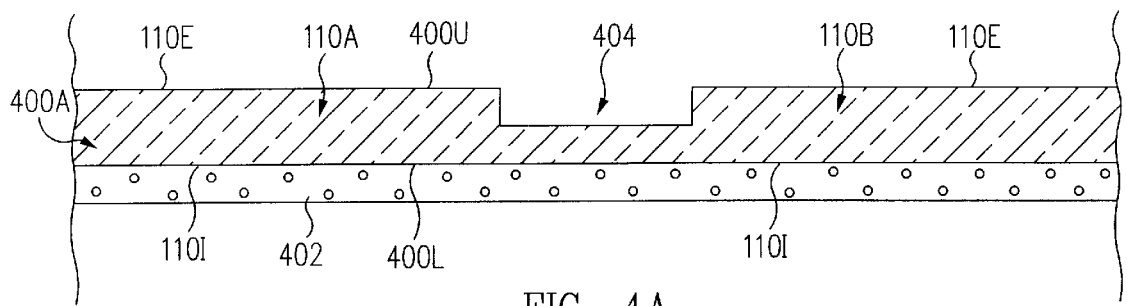
FIGS. 4A, 4B and 4C are cross-sectional views of a single sheet during the formation of a plurality of windows in accordance with various embodiments of the present invention.

In this embodiment, window 110 including locking feature 300 is fabricated simultaneously with a plurality of windows 110 from a single sheet. FIG. 4A is a cross-sectional view of a window sheet 400A during the formation of a plurality of windows 110 including a first window 110A and a second window 110B. Initially, a lower, e.g., first, surface 400L of window sheet 400A, e.g., a sheet of borosilicate glass, is attached to a support 402 such as a sticky tape used in wafer dicing as is well known to those of skill in the art.

A series of shallow wide cuts, e.g., rectangular grooves, including a first shallow wide cut 404 are made in an upper, e.g., second, surface 400U of window sheet 400A, for example, with a wide saw blade. Of importance, shallow wide cut 404 only scores window sheet 400A and does not extend through window sheet 400A. Illustratively, shallow wide cut 404 is 0.015 inches (0.38 mm) wide and extends halfway through window sheet 400A. The other shallow wide cuts are similar to shallow wide cut 404.

Figure 4B:
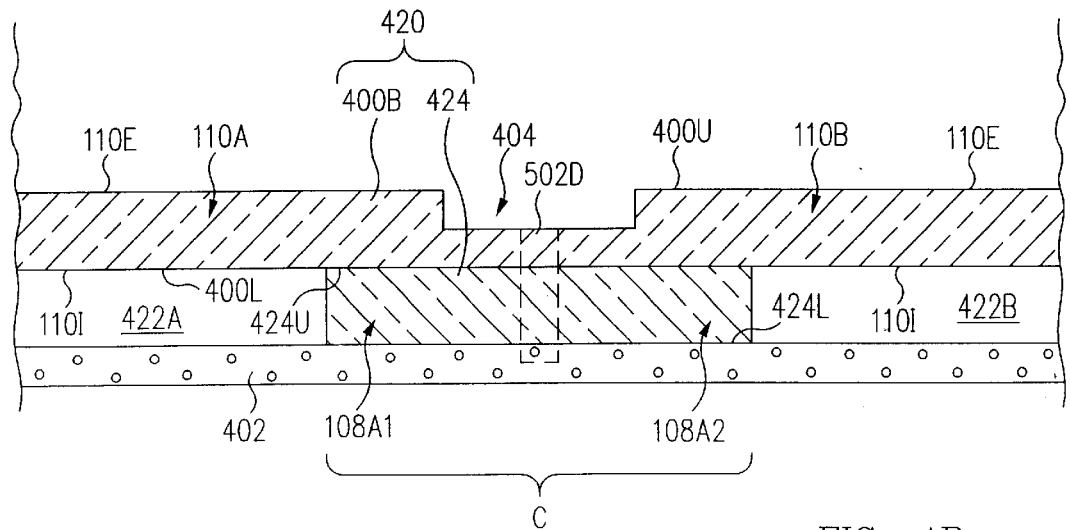

FIG. 4B is a cross-sectional view of a single sheet 420 during the formation of a plurality of windows 110 and window supports 108A including a first window 110A and window support 108A1 and a second window 110B and window support 108A2.

Initially, a plurality of apertures 422 including a first aperture 422A and a second aperture 422B are formed, e.g., by drilling, punching, lasering or other technique, through a window support sheet 424, e.g., a first sheet of borosilicate glass. An upper, e.g., first, surface 424U of window support sheet 424 is attached to a lower surface 400L of a window sheet 400B, e.g., a second sheet of borosilicate glass. For example, an adhesive, such as a B-staged epoxy adhesive, is screened or dispensed onto upper surface 424U or lower surface 400L and cured although other techniques such as the use of a double sided sticky tape are used in other embodiments to attach upper surface 424U to lower surface 400L. Generally, upper surface 424U of window support sheet 424 is directly attached to a first region C of lower surface 400L of window sheet 400B laterally between aperture 422A and aperture 422B. A lower, e.g., second, surface 424L of window support sheet 424 is attached to support 402.

A series of shallow wide cuts, e.g., rectangular grooves, including a first shallow wide cut 404 are made in an upper surface 400U of window sheet 400B, for example, with a wide saw blade. Shallow wide cut 404 is made directly opposite of region C of lower surface 400L of window sheet 400B where window support sheet 424 directly contacts lower surface 400L of window sheet 400B. In other words, shallow wide cut 404 is made laterally between aperture 422A and aperture 422B and not directly opposite an aperture 422.

In one embodiment, shallow wide cut 404 only scores window sheet 400B and does not extend through window sheet 400B. Illustratively, shallow wide cut 404 is 0.015 inches (0.38 mm) wide and extends halfway through window sheet 400B. However, in an alternative embodiment, shallow wide cut 404 extends all the way through window sheet 400B and scores upper surface 424U of window support sheet 424. The other shallow wide cuts are similar to shallow wide cut 404.

Figure 4C:
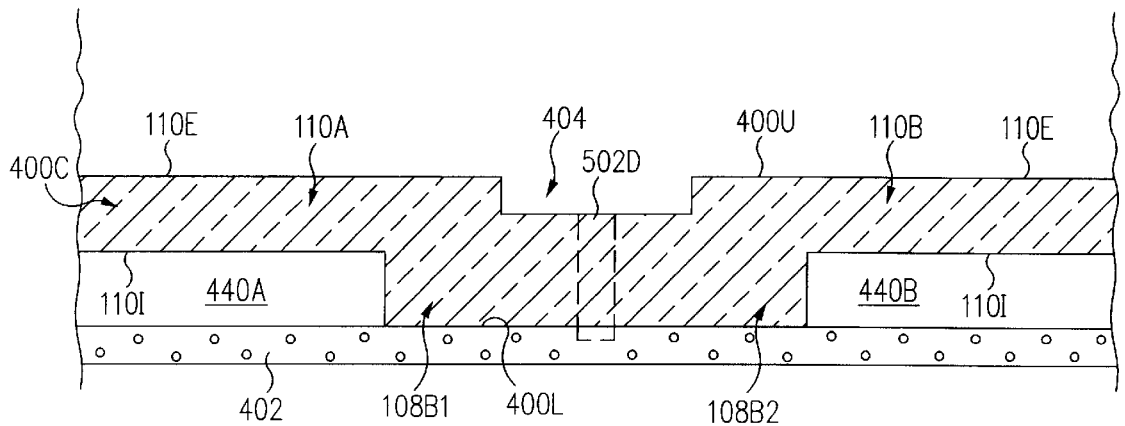

FIG. 4C is a cross-sectional view of a window sheet 400C during the formation of a plurality of windows 110 and window supports 108B including a first window 110A and window support 108B1 and a second window 110B and window support 108B2.

Initially, a plurality of cavities 440 including a first cavity 440A and a second cavity 440B are formed, e.g., by drilling, grinding, lasering or other technique, in a lower surface 400L of window sheet 400C, e.g., a sheet of borosilicate glass. After formation of cavities 440A, 440B, lower surface 400L of window sheet 400B is attached to support 402.

A series of shallow wide cuts, e.g., rectangular grooves, including a first shallow wide cut 404 are made in an upper surface 400U of window sheet 400C, for example, with a wide saw blade. Shallow wide cut 404 is made laterally between cavity 440A and cavity 440B, i.e., is not made directly opposite a cavity 440. Of importance, shallow wide cut 404 only scores window sheet 400C and does not extend through window sheet 400C. Illustratively, shallow wide cut 404 is 0.015 inches (0.38 mm) wide and extends halfway or less through window sheet 400C. The other shallow wide cuts are similar to shallow wide cut 404.

Figure 5:
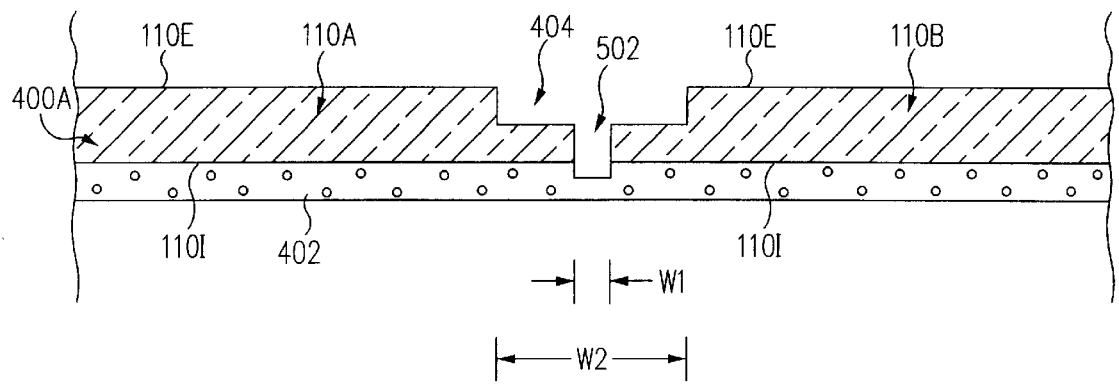
FIG. 5 is a cross-sectional view of the sheet of FIG. 4A at a later stage of fabrication.

FIG. 5 is a cross-sectional view of window sheet 400A of FIG. 4A at a later stage of fabrication. After the series of shallow wide cuts including shallow wide cut 404 are made, a series of deep narrow cuts, e.g., rectangular grooves, including a deep narrow cut 502 are made, for example, with a narrow saw blade. As shown in FIG. 5, deep narrow cut 502 is made in the approximate center of shallow wide cut 404 and has a width W1 less than a width W2 of shallow wide cut 404. Deep narrow cut 502 extends all the way through window sheet 400A thus singulating window 110A from window 110B. Windows 110A, 110B are held by support 402. Illustratively, deep narrow cut 502 is 0.008 inches (0.20 mm) wide. The other deep narrow cuts are made in the approximate centers of the other corresponding shallow wide cuts in a similar manner so are not discussed further to avoid detracting from the principals of the invention.

Advantageously, the shallow wide cuts and the deep narrow cuts made in window sheet 400A are desirably rough cuts to enhance the locking ability of locking feature 300 (FIG. 3). Since rough cuts are desirable, the shallow wide cuts and the deep narrow cuts are made using a high-speed cutting process.

In contrast, for aesthetic, safety and other reasons, prior art windows for image sensor assemblies were formed with finished cuts, i.e., smooth cuts. In other words, chipped, jagged or damaged windows were unacceptable for use in prior art image sensor assemblies and were discarded. Further, to form windows with the finished cuts, a slow-speed cutting process was used. For these reasons, windows 110 in accordance with the present invention are fabricated at a lower cost than windows of prior art image sensor assemblies.

Although formation of deep narrow cut 502 in window sheet 400A of FIG. 4A is described above, in light of this disclosure, those of skill in the art will understand that similar deep narrow cuts 502 are made in sheet 420 of FIG. 4B and in window sheet 400C of FIG. 4C thus singulating windows 110 and window supports 108A, window supports 108I, respectively. More particularly, these deep narrow cuts 502 extend all the way through window sheet 400B/ window support sheet 424 (FIG. 4B) or window sheet 400C (FIG. 4C) thus singulating windows 110 and window supports 108A, window supports 108B, respectively. These deep narrow cuts 502 are illustrated as dashed lines 502D in FIGS. 4B, 4C.

Figure 6:
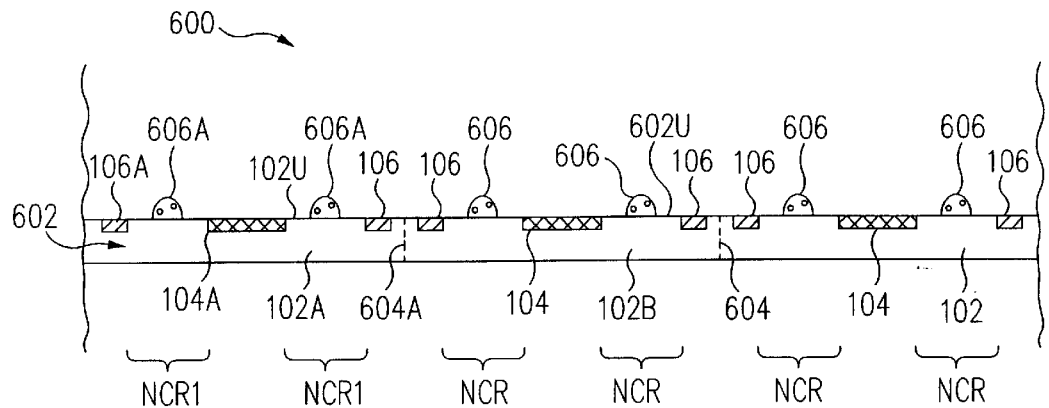
FIG. 6 is a cross-sectional view of a structure during the fabrication of a plurality of image sensor packages in accordance with the present invention.

FIG. 6 is a cross-sectional view of a structure 600 during the fabrication of a plurality of packages 100 (FIGS. 1, 2A) in accordance with the present invention. Structure 600 includes an image sensor substrate 602 such as a silicon wafer. Image sensor substrate 602 includes a plurality of image sensors 102 integrally connected together. Image sensors 102 include active areas 104 formed on an upper, e.g., first, surface 602U of image sensor substrate 602. Image sensors 102 further include bond pads 106 on upper surface 602U of image sensor substrate 602. Bond pads 106 are connected to the internal circuitry of image sensors 102. Further, image sensors 102 include noncritical regions NCR on upper surface 602U of image sensor substrate 602 between bond pads 106 and active areas 104.

To illustrate, a first image sensor 102A of the plurality of image sensors 102 includes a first active area 104A of the plurality of active areas 104. Image sensor 102A also includes a first bond pad 106A of the plurality of bond pads 106 and a first noncritical region NCR1 of the plurality of noncritical regions NCR. The other image sensors 102 include active areas 104, bond pads 106 and noncritical regions NCR in a similar manner.

Image sensors 102 are integrally connected together in an array, e.g., a 2×2, 3×3 . . . or n×m array. Each of image sensors 102 is delineated by a singulation street 604, which is located between adjacent image sensors 102. For example, a first singulation street 604A of the plurality of singulation streets 604 delineates first image sensor 102A from a second image sensor 102B of the plurality of image sensors 102. The other image sensors 102 are similarly delineated from adjacent image sensors 102 by corresponding singulation streets 604.

As shown in FIG. 6, beads 606 are applied to noncritical regions NCR such that beads 606 are on noncritical regions NCR. Beads 606 are applied around the entire peripheries of active areas 104.

To illustrate, a first bead 606A of the plurality of beads 606 is applied to, and is on, noncritical region NCR1. Bead 606A is applied around the entire periphery of active area 104A and surrounds active area 104A.

In one embodiment, bead 606A is applied by needle dispensing an appropriate bonding material, such as adhesive, as those of skill in the art will understand. However, in light of this disclosure, those of skill in the art will also recognize that other techniques can be used to apply bead 606A to noncritical region NCR1. For example, bead 606A is formed by screening an epoxy adhesive or by applying a double sided sticky tape. The other beads 606 are formed in a similar manner one at a time or, alternatively, simultaneously.

Figure 7A:
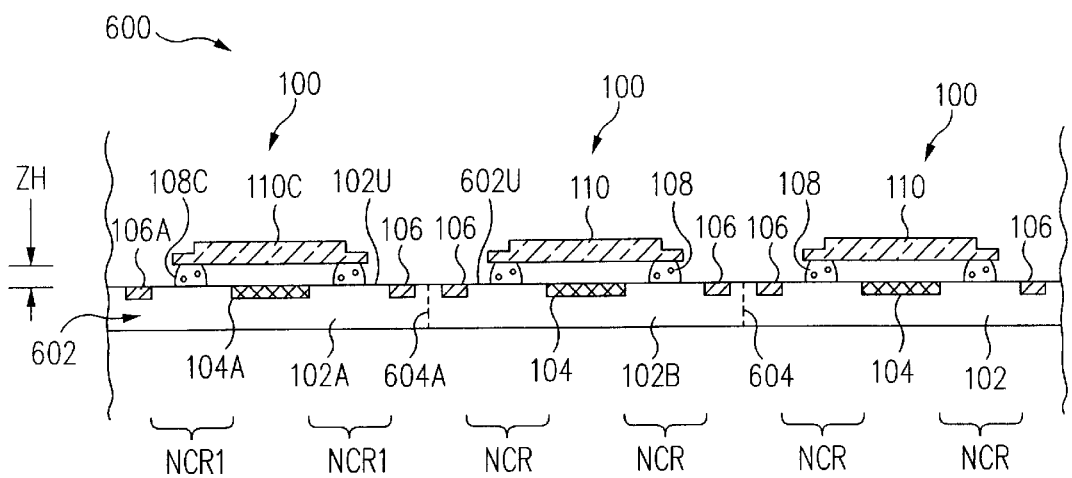
FIGS. 7A and 7B are cross-sectional views of the structure of FIG. 6 at a further stage of fabrication in accordance with various embodiments of the present invention.

FIG. 7A is a cross-sectional view of structure 600 at a further stage of fabrication in accordance with one embodiment of the present invention. Referring now to FIGS. 6 and 7A together, windows 110 are pressed into corresponding beads 606 to form corresponding window supports 108. For example, a pick and place machine removes windows 110 from support 402 (FIG. 5) and presses windows 110 into corresponding beads 606 to form corresponding window supports 108.

To illustrate, a first window 110C of the plurality of windows 110 is pressed into bead 606A to form window support 108C and, more generally, to mount window 110C to image sensor 102A. As window 110C is pressed into bead 606A, bead 606A is squeezed by window 110C downwards, e.g., in a first direction, towards noncritical region NCR1.

Bead 606A has a volume sufficient to securely and reliably mount window 110C to image sensor 102A. Further, bead 606A has a volume sufficient to provide an adequate clearance between window 110C and active area 104A. However, bead 606A has a volume insufficient to have window support 108C extend over any of bond pads 106 or active area 104A.

Advantageously, by pressing window 110C into bead 606A in the above manner, window 110C is essentially parallel to upper surface 102U of image sensor 102A. Further, distance ZH between window 110C and image sensor 102A is precisely controlled to within tight tolerance.

In the prior art, the window was placed on a shelf of the housing after the housing was fabricated. Since a significant tolerance was associated with the window placement, the distance between the window and the image sensor had significant variations from assembly to assembly. However, to insure optimum operation of the image sensor, it is important that the distance between the window and image sensor be precise. Since the tolerance in this distance is reduced in package 100, the performance of package 100 is superior to that the prior art.

Although the placement of window 110C into bead 606A is described above, it is understood that the other windows 110 are placed into the other corresponding beads 606 to form the other corresponding window supports 108 in a similar manner, one at a time or, alternatively, simultaneously. After windows 110 are placed into corresponding beads 606, window supports 108 are cured. For example, window supports 108 are cured with ultraviolet light or heat. Further, instead of being cured, window supports 108 can be gelled or made tacky. Generally, window supports 108 are setup, e.g., cured, gelled or made tacky. As discussed further below in reference to FIGS. 8, 9 and 10, windows 110 are held in place by window supports 108 in combination with the package body. Accordingly, window supports 108 can be formed with less structural integrity and adhesion to windows 110 than otherwise would be required if window supports 108 were entirely responsible for supporting windows 110.

Image sensor substrate 602 is singulated along singulation streets 604 to form a plurality of packages 100 (FIGS. 1 and 2A). Singulation is, accomplished using any one of a number of conventional singulation techniques, e.g., by laser cutting or mechanical sawing through image sensor substrate 602.

Of importance, active areas 104 of image sensors 102 are protected by windows 110 (in combination with window supports 108) during singulation. More particularly, windows 110 protect active areas 104 from contamination and scratching during singulation, e.g., from silicon shards. Windows 110 also protect active areas 104 during subsequent processing of package 100, e.g., during subsequent wire bonding and/or encapsulation and/or molding. As a result, damage or destruction of image sensors 102 is avoided. Accordingly, yield is increased and package cost is reduced compared to the prior art.

Further, by forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each package 100 is minimized. However, in light of this disclosure, those of skill in the art will recognize that packages 100 can also be manufactured on an individual basis, if desired. For example, window 110 is attached by window support 108 after image sensor 102 is die attached and/or wire bonded.

Figure 7B:
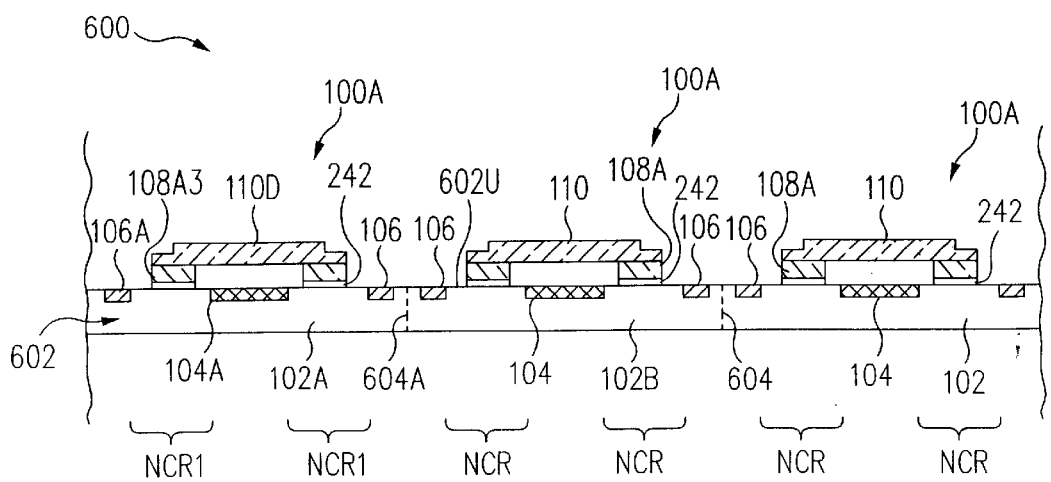

FIG. 7B is a cross-sectional view of structure 600 at a further stage of fabrication in accordance with an alternative embodiment of the present invention.

Referring now to FIGS. 6 and 7B together, windows 110 having window supports 108A attached are pressed into corresponding beads 606 to mount windows 110 and window supports 108A to image sensors 102.

Illustratively, a pick and place machine removes windows 110 and window supports 108A from support 402 of FIG. 4B and presses window supports 108A into corresponding beads 606. For example, a first window 110D of the plurality of windows 110 has a first window support 108A3 attached thereto. Window support 108A3 is pressed into bead 606A to mount window 110D and window support 108A3 to image sensor 102A. As window support 108A3 is pressed into bead 606A, bead 606A is squeezed by window support 108A3 downwards towards noncritical region NCR1. Bead 606A forms adhesive 242.

Although the placement of window 110D and window support 108A3 into bead 606A is described above, it is understood that the other windows 110 and window supports 108A are placed into the other corresponding beads 606 to mount the other windows 110 and window supports 108A to the other image sensors 102 in a similar manner, one at a time or, alternatively, simultaneously. After windows 110 are placed into corresponding beads 606, beads 606, i.e., adhesives 242, are setup.

In the embodiment described above and illustrated in FIG. 7B, windows 110 and window supports 108A of FIG. 4B are mounted to image sensors 102 to fabricate package 100A of FIG. 2B. However, in an alternative embodiment, windows 110 and window supports 108B of FIG. 4C are mounted to image sensors 102 to fabricate package 100B of FIG. 2C in a similar manner.

In alternative embodiments, beads 606 are not directly applied to upper surface 602U of image sensor substrate 602 as shown in FIG. 6, but are applied directly to windows 110 (FIG. 7A) or, alternatively, to window supports 108A (FIG. 7B). To apply beads 606 to noncritical regions NCR in accordance with this embodiment, beads 606 are pressed into noncritical regions NCR during mounting of windows 110 (FIG. 7A) or windows 110/window supports 108A (FIG. 7B).

In one embodiment, after singulation of image sensor substrate 602, package 100 (FIG. 2A) is further packaged. Advantageously, since active area 104 of image sensor 102 is protected by window 110, package 100 can be further packaged using any one of a number of conventional packaging techniques, e.g., standard molding and/or liquid encapsulation techniques. For example, package 100 is put into a flip chip image sensor assembly such as that illustrated in FIG. 8, a leadframe image sensor assembly such as that illustrated in FIG. 9 or a wirebonded image sensor assembly such as that illustrated in FIG. 10.

Figure 8:
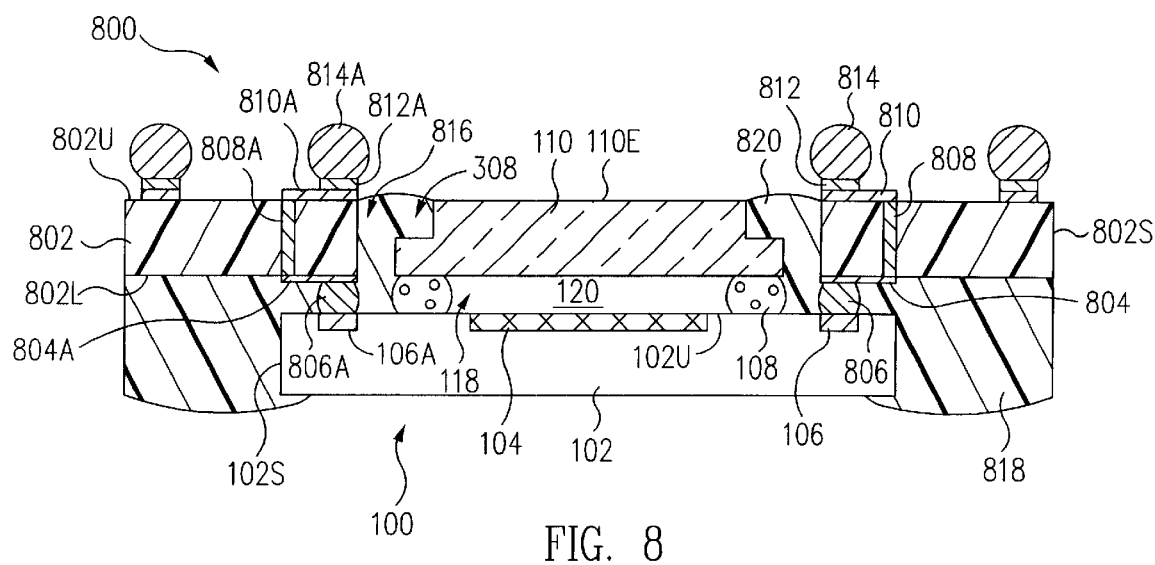
FIG. 8 is a cross-sectional view of a flip chip image sensor assembly in accordance with one embodiment of the present invention.

FIG. 8 is a cross-sectional view of a flip chip image sensor assembly 800 (hereinafter assembly 800) in accordance with one embodiment of the present invention. Referring to FIG. 8, assembly 800 includes a substrate 802. To illustrate, substrate 802 is a printed circuit board, ceramic, tape, or other material as those of skill in the art will understand.

Substrate 802 includes a plurality of electrically conductive traces 804 formed on a lower, e.g., first, surface 802L of substrate 802. Bond pads 106 are electrically connected to corresponding traces 804 by corresponding electrically conductive bumps 806. Traces 804 are electrically connected to corresponding electrically conductive vias 808 which extend from lower surface 802L to an upper, e.g., second, surface 802U of substrate 802 opposite lower surface 802L. Vias 808 are electrically connected to corresponding electrically conductive traces 810 on upper surface 802U of substrate 802. Formed on traces 810 are corresponding electrically conductive pads 812. Formed on pads 812 are corresponding electrically conductive interconnection balls 814 such as solder balls. Interconnection balls 814 are used to electrically connect assembly 800 to a larger substrate (not shown) such as a printed circuit mother board.

To illustrate, a first bond pad 106A of the plurality of bond pads 106 is electrically connected to a first trace 804A of the plurality of traces 804 by a first bump 806A of the plurality of bumps 806. Trace 804A is electrically connected to a first via 808A of the plurality of vias 808. Via 808A is electrically connected to a first trace 810A of the plurality of traces 810. A first pad 812A of the plurality of pads 812 is formed on trace 810A. Formed on pad 812A is a first interconnection ball 814A of the plurality of interconnection balls 814.

As set forth above, an electrically conductive pathway between bond pad 106A and interconnection ball 814A is formed by bump 806A, trace 804A, via 808A, trace 810A and pad 812A. The other bond pads 106, bumps 806, traces 804, vias 808, traces 810, pads 812 and interconnection balls 814 are electrically connected to one another in a similar fashion so are not discussed further to avoid detracting from the principals of the invention.

Although a particular electrically conductive pathway between interconnection ball 814A and bond pad 106A is described above, in light of this disclosure, those of skill in the art will recognize that other electrically conductive pathways can be formed. For example, substrate 802 is a multi-layered laminated substrate and, instead of straight-through vias 808, a plurality of electrically conductive traces on various layers in substrate 802 are interconnected by a plurality of electrically conductive vias to form the electrical interconnections between traces 804 and 810.

As a further example, vias 808 extend along sides 802S of substrate 802 and traces 804 and 810 extend to sides 802S. As another alternative, interconnection balls 814 are distributed in an array format to form a ball grid array (BGA) type package. Alternatively, interconnection balls 814 are not formed, e.g., to form a metal land grid array (LGA) type package or a leadless chip carrier (LCC) type package. Other electrically conductive pathway modifications will be obvious to those of skill in the art.

Substrate 802 includes a central aperture 816. Window 110 is located within, or is located adjacent to, central aperture 816. In particular, exterior surface 110E of window 110 is exposed through aperture 816. During use, radiation is directed at assembly 800. This radiation passes through window 110, through medium 120, and strikes active area 104. Active area 104 responds to this radiation as is well known to those of skill the art.

Assembly 800 further includes a package body 818. Package body 818 is an electrically insulating material and electrically protects, e.g., prevents shorting of, and environmentally protects, e.g., from moisture, the various electrically conductive structures of assembly 800. In addition, package body 818 provides mechanical strength to assembly 800 and, in particular, minimizes failure of bumps 806 and the associated detachment of image sensor 102 from substrate 802.

In this embodiment, package body 818 encloses upper surface 102U and sides 102S of image sensor 102, bond pads 106, lower surface 802L and central aperture 816 of substrate 802, traces 804, bumps 806 and window support 108. Further, package body 818, in combination with window support 108, mechanically locks window 110 in place. In particular, package body 818 includes an exterior locking feature 820, which fills pocket 308 of window 110, thus mechanically locking window 110 in place. In one embodiment, package body 818 including exterior locking feature 820 is integral, i.e., is one piece and not a plurality of single pieces connected together. In this embodiment, package body 818 leaves exposed exterior surface 110E of window 110, i.e., package body 818 does not contact or cover exterior surface 110E.

Package body 818 is formed of any one of a number of conventional packaging materials. For example, package body 818 is formed from a plastic encapsulant or, alternatively, a liquid encapsulant.

Figure 9:
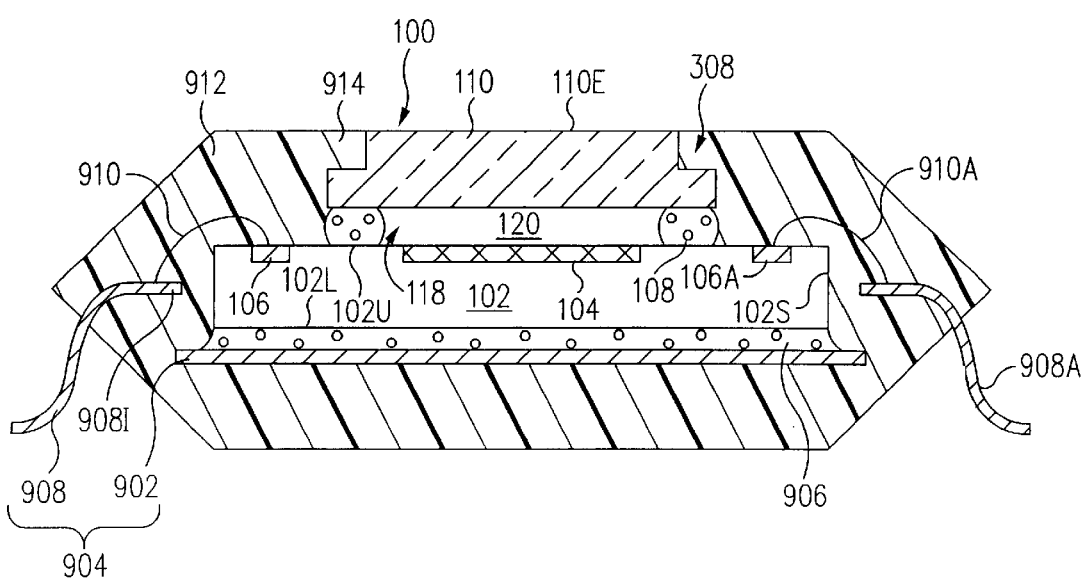
FIG. 9 is a cross-sectional view of a leadframe image sensor assembly in accordance with an alternative embodiment of the present invention.

FIG. 9 is a cross-sectional view of a leadframe image sensor assembly 900 (hereinafter assembly 900) in accordance with an alternative embodiment of the present invention. Referring now to FIG. 9, a lower, e.g., second, surface 102L of image sensor 102 is attached to a die attach pad 902 of a leadframe 904. For example, lower surface 102L is attached to die attach pad 902 with adhesive 906.

Leadframe 904 further includes a plurality of leads 908. Bond pads 106 are electrically connected to corresponding leads 908 by corresponding bond wires 910. For example, a first bond pad 106A of the plurality of bond pads 106 is electrically connected to a first lead 908A of the plurality of leads 908 by a first bond wire 910A of the plurality of bond wires 910. The other bond pads 106 are electrically connected to the other corresponding leads 908 by the other corresponding bond wires 910 in a similar fashion so are not discussed further.

Assembly 900 further includes a package body 912. Package body 912 is an electrically insulating material and electrically protects, e.g., prevents shorting of, and environmentally protects, e.g., from moisture, the various electrically conductive structures of assembly 900.

Package body 912 encloses upper surface 102U and sides 102S of image sensor 102, bond pads 106, bond wires 910, die attach pad 902, inner ends 908I of leads 908, and window support 108. Further, package body 912, in combination with window support 108, mechanically locks window 110 in place. In particular, package body 912 includes an exterior locking feature 914, which fills pocket 308 of window 110, thus mechanically locking window 110 in place. In one embodiment, package body 912 including exterior locking feature 914 is integral. In this embodiment, package body 912 leaves exposed exterior surface 110E of window 110, i.e., package body 912 does not contact or cover exterior surface 110E.

Package body 912 is formed of any one of a number of conventional packaging materials. For example, package body 912 is formed from a plastic encapsulant or, alternatively, a liquid encapsulant.

Figure 10:
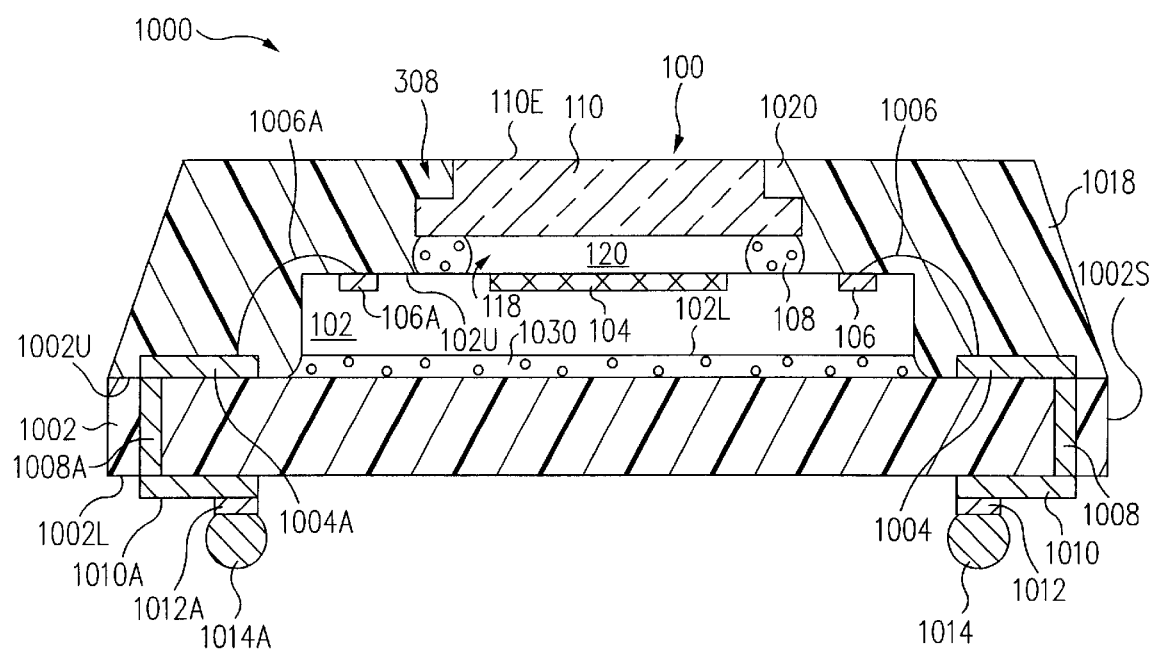
FIG. 10 is a cross-sectional view of a wirebonded image sensor assembly in accordance with yet another alternative embodiment of the present invention.

FIG. 10 is a cross-sectional view of a wirebonded image sensor assembly 1000 (hereinafter assembly 1000) in accordance with yet another alternative embodiment of the present invention. Referring to FIG. 10, assembly 1000 includes a substrate 1002. To illustrate, substrate 1002 is a printed circuit board, ceramic, or tape, although other materials are used in other embodiments. Lower surface 102L of image sensor 102 is attached to an upper, e.g., first, surface 1002U of substrate 1002, for example, with adhesive 1030.

Substrate 1002 includes a plurality of electrically conductive traces 1004 formed on upper surface 1002U of substrate 1002. Bond pads 106 are electrically connected to corresponding traces 1004 by corresponding electrically conductive bond wires 1006. Traces 1004 are electrically connected to corresponding electrically conductive vias 1008 which extend from upper surface 1002U to a lower, e.g., second, surface 1002L of substrate 1002 opposite upper surface 1002U. Vias 1008 are electrically connected to corresponding electrically conductive traces 1010 on lower surface 1002L of substrate 1002. Formed on traces 1010 are corresponding electrically conductive pads 1012. Formed on pads 1012 are corresponding electrically conductive interconnection balls 1014 such as solder balls. Interconnection balls 1014 are used to electrically connect assembly 1000 to a larger substrate (not shown) such as a printed circuit mother board.

To illustrate, a first bond pad 106A of the plurality of bond pads 106 is electrically connected to a first trace 1004A of the plurality of traces 1004 by a first bond wire 1006A of the plurality of bond wires 1006. Trace 1004A is electrically connected to a first via 1008A of the plurality of vias 1008. Via 1008A is electrically connected to a first trace 1010A of the plurality of traces 1010. A first pad 1012A of the plurality of pads 1012 is formed on trace 1010A. Formed on pad 1012A is a first interconnection ball 1014A of the plurality of interconnection balls 1014.

As set forth above, an electrically conductive pathway between bond pad 106A and interconnection ball 1014A is formed by bond wire 1006A, trace 1004A, via 1008A, trace 100A and pad 1012A. The other bond pads 106, bond wires 1006, traces 1004, vias 1008, traces 1010, pads 1012 and interconnection balls 1014 are electrically connected to one another in a similar fashion so are not discussed further to avoid detracting from the principals of the invention.

Although a particular electrically conductive pathway between interconnection ball 1014A and bond pad 106A is described above, in light of this disclosure, those of skill in the art will recognize that other electrically conductive pathways can be formed. For example, substrate 1002 is a multi-layered laminated substrate and, instead of straight-through vias 1008, a plurality of electrically conductive traces on various layers in substrate 1002 are interconnected by a plurality of electrically conductive vias to form the electrical interconnections between traces 1004 and 1010.

As a further example, vias 1008 extend along sides 1002S of substrate 1002 and traces 1004 and 1010 extend to sides 1002S. As another alternative, interconnection balls 1014 are distributed in an array format to form a ball grid array (BGA) type package. Alternatively, interconnection balls 1014 are not formed, e.g., to form a metal land grid array (LGA) type package or a leadless chip carrier (LCC) type package. Other electrically conductive pathway modifications will be obvious to those of skill in the art.

Assembly 1000 further includes a package body 1018. Package body 1018 is an electrically insulating material and electrically protects, e.g., prevents shorting of, and environmentally protects, e.g., from moisture, the various electrically conductive structures of assembly 1000.

In this embodiment, package body 1018 encloses upper surface 102U of image sensor 102, bond pads 106, upper surface 1002U of substrate 1002, traces 1004, bond wires 1006 and window support 108. Further, package body 1018, in combination with window support 108, mechanically locks window 110 in place. In particular, package body 1018 includes an exterior locking feature 1020, which fills pocket 308 of window 110, thus mechanically locking window 110 in place. In one embodiment, package body 1018 including exterior locking feature 1020 is integral. In this embodiment, package body 1018 leaves exposed exterior surface 110E of window 110, i.e., package body 1018 does not contact or cover exterior surface 11E.

Package body 1018 is formed of any one of a number of conventional packaging materials. For example, package body 1018 is formed from a plastic encapsulant or, alternatively, a liquid encapsulant.

FIGS. 8, 9 and 10 are examples of image sensor assemblies, which incorporate package 100 in accordance with present invention. In light of this disclosure, those of skill in the art will recognize that other image sensor assemblies, which incorporate package 100, can be fabricated. For example, solder masks can be applied to upper surface 802U and/or lower surface 802L of substrate 802 (FIG. 8) and/or upper surface 1002U and/or lower surface 1002L of substrate 1002 (FIG. 9).

This application is related to Glenn et al., commonly assigned and co-filed U.S. patent application Ser. No. [ATTORNEY DOCKET NUMBER G0019M], entitled "METHOD OF FORMING AN IMAGE SENSOR PACKAGE HAVING SEALED CAVITY OVER ACTIVE AREA", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A structure comprising:
   a window support sheet having a first aperture and a second aperture formed therethrough; and
   a window sheet, a first surface of said window support sheet being in direct contact with a first region of a first surface of said window sheet laterally between said first aperture and said second aperture, a second surface of said window sheet comprising a first groove directly opposite said first region.

2. The structure of claim 1 wherein said first groove is rectangular.

3. The structure of claim 1 wherein said first groove scores said window sheet.

4. The structure of claim 3 wherein said first groove extends halfway through said window sheet.

5. The structure of claim 1 wherein said first groove extends through said window sheet.

6. The structure of claim 5 wherein said first groove scores said window support sheet.

7. The structure of claim 1 further comprising a second groove in said first groove, a width of said second groove being less than a width of said first groove.

8. The structure of claim 7 wherein said second groove is made in a center of said first groove.

9. The structure of claim 7 wherein said second groove extends through said window sheet and through said window support sheet.

10. The structure of claim 9 wherein said window support sheet comprises a first window support and a second window support and wherein said window sheet comprises a first window and a second window, said second groove singulating said first window support from said second window support and said first window from said second window.

11. The structure of claim 1 wherein said window support sheet is a first sheet of borosilicate glass and said window sheet is a second sheet of borosilicate glass.

12. A structure comprising:
    a window sheet having a first cavity and a second cavity in a first surface of said window sheet and a first groove in a second surface of said window sheet, said first groove being laterally between said first cavity and said second cavity.

13. The structure of claim 12 further comprising a second groove in said first groove, a width of said second groove being less than a width of said first groove.

14. The structure of claim 13 wherein said second groove is made in a center of said first groove.

15. The structure of claim 13 wherein said second groove extends through said window sheet.

16. The structure of claim 13 wherein said window sheet comprises a first window support integral with a first window and a second window support integral with a second window, said second groove singulating said first window support from said second window support and said first window from said second window.

* * * * *